United States Patent
Oganesian

(10) Patent No.: US 9,230,947 B2
(45) Date of Patent: Jan. 5, 2016

(54) METHOD OF FORMING 3D INTEGRATED MICROELECTRONIC ASSEMBLY WITH STRESS REDUCING INTERCONNECTS

(71) Applicant: Optiz, Inc., Palo Alto, CA (US)

(72) Inventor: Vage Oganesian, Sunnyvale, CA (US)

(73) Assignee: OPTIZ, INC., Palo Alto, CA (US)

( * ) Notice: Subject to any disclaimer, the term of this patent is extended or adjusted under 35 U.S.C. 154(b) by 0 days.

(21) Appl. No.: 14/013,317

(22) Filed: Aug. 29, 2013

(65) Prior Publication Data

US 2014/0004647 A1    Jan. 2, 2014

Related U.S. Application Data

(62) Division of application No. 13/157,202, filed on Jun. 9, 2011, now Pat. No. 8,552,518.

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/76898* (2013.01); *H01L 24/19* (2013.01); *H01L 24/20* (2013.01); *H01L 27/1469* (2013.01);
(Continued)

(58) Field of Classification Search
CPC ..... H01L 21/20; H01L 25/50; H01L 27/1469; H01L 27/14603; H01L 27/14643
USPC ...................... 438/67; 257/443, E31.124, 686
See application file for complete search history.

(56) References Cited

U.S. PATENT DOCUMENTS 6,777,767 B2  8/2004 Badehi
6,972,480 B2  12/2005 Zilber et al.
(Continued)

FOREIGN PATENT DOCUMENTS

CN  1977382 A   6/2007
CN  101232033 A  7/2008
(Continued)

OTHER PUBLICATIONS

U.S. Appl. No. 13/157,193, filed Jun. 2011, Oganesian.
(Continued)

*Primary Examiner* — Phuc Dang
(74) *Attorney, Agent, or Firm* — DLA Piper LLP (US)

(57) ABSTRACT

A microelectronic assembly and method of making, which includes a first microelectronic element (including a substrate with first and second opposing surfaces, a semiconductor device, and conductive pads at the first surface which are electrically coupled to the semiconductor device) and a second microelectronic element (including a handler with first and second opposing surfaces, a second semiconductor device, and conductive pads at the handler first surface which are electrically coupled to the second semiconductor device). The first and second microelectronic elements are integrated such that the second surfaces face each other. The first microelectronic element includes conductive elements each extending from one of its conductive pads, through the substrate to the second surface. The second microelectronic element includes conductive elements each extending between the handler first and second surfaces. The conductive elements of the first microelectronics element are electrically coupled to the conductive elements of the second microelectronics element.

12 Claims, 9 Drawing Sheets

(51) Int. Cl.
- *H01L 27/146* (2006.01)
- *H01L 21/768* (2006.01)
- *H01L 23/00* (2006.01)
- *H01L 23/31* (2006.01)
- *H01L 23/14* (2006.01)
- *H01L 23/498* (2006.01)
- *H01L 23/538* (2006.01)

(52) U.S. Cl.
CPC .... *H01L27/14618* (2013.01); *H01L 27/14683* (2013.01); *H01L 23/147* (2013.01); *H01L 23/3128* (2013.01); *H01L 23/49827* (2013.01); *H01L 23/5389* (2013.01); *H01L 24/16* (2013.01); *H01L 24/32* (2013.01); *H01L 24/73* (2013.01); *H01L 2224/0401* (2013.01); *H01L 2224/04105* (2013.01); *H01L 2224/16225* (2013.01); *H01L 2224/32225* (2013.01); *H01L 2224/73267* (2013.01)
USPC ............................................ 438/67; 257/443

(56) References Cited

U.S. PATENT DOCUMENTS

| | | | |
|---|---|---|---|
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,335,972 B2 | 2/2008 | Chanchani | |
| 7,394,148 B2 | 7/2008 | Karnezos | |
| 7,495,341 B2 | 2/2009 | Zilber et al. | |
| 7,642,629 B2 | 1/2010 | Zilber et al. | |
| 2001/0002625 A1* | 6/2001 | Fujii et al. | 174/262 |
| 2004/0100772 A1* | 5/2004 | Chye et al. | 361/702 |
| 2004/0108587 A1 | 6/2004 | Chudzik et al. | |
| 2004/0251525 A1 | 12/2004 | Zilber | |
| 2004/0262733 A1* | 12/2004 | Kumamoto | 257/686 |
| 2005/0104179 A1 | 5/2005 | Zilber | |
| 2005/0205977 A1 | 9/2005 | Zilber | |
| 2007/0048902 A1* | 3/2007 | Hiatt et al. | 438/108 |
| 2007/0138498 A1 | 6/2007 | Zilber | |
| 2007/0158787 A1 | 7/2007 | Chanchani | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |
| 2008/0179497 A1* | 7/2008 | Maniam et al. | 250/214 AL |
| 2008/0246136 A1 | 10/2008 | Haba et al. | |
| 2009/0115047 A1 | 5/2009 | Haba | |
| 2009/0160065 A1 | 6/2009 | Haba | |
| 2009/0212381 A1 | 8/2009 | Crisp | |
| 2009/0224404 A1* | 9/2009 | Wood et al. | 257/738 |
| 2009/0283898 A1* | 11/2009 | Janzen et al. | 257/698 |
| 2010/0053407 A1 | 3/2010 | Crisp | |
| 2010/0096739 A1* | 4/2010 | Kawabata et al. | 257/686 |
| 2010/0102428 A1* | 4/2010 | Lee et al. | 257/686 |
| 2010/0109138 A1* | 5/2010 | Cho | 257/686 |
| 2010/0225006 A1 | 9/2010 | Haba | |
| 2010/0230812 A1 | 9/2010 | Oganesian | |
| 2011/0012259 A1 | 1/2011 | Grinman | |
| 2011/0024899 A1* | 2/2011 | Masumoto et al. | 257/737 |
| 2011/0031629 A1 | 2/2011 | Haba | |
| 2011/0033979 A1 | 2/2011 | Haba | |
| 2011/0037170 A1 | 2/2011 | Shinohara | |
| 2011/0049696 A1 | 3/2011 | Haba | |
| 2011/0108308 A1 | 5/2011 | Kamada | |
| 2011/0133333 A1* | 6/2011 | Kwon et al. | 257/737 |
| 2011/0187007 A1 | 8/2011 | Haba | |
| 2011/0210444 A1* | 9/2011 | Jeng et al. | 257/738 |
| 2011/0317381 A1* | 12/2011 | Kim et al. | 361/761 |
| 2012/0018863 A1 | 1/2012 | Oganesian | |
| 2012/0018868 A1 | 1/2012 | Oganesian | |
| 2012/0018893 A1 | 1/2012 | Oganesian | |
| 2012/0018894 A1 | 1/2012 | Oganesian | |
| 2012/0018895 A1 | 1/2012 | Oganesian | |
| 2012/0020026 A1* | 1/2012 | Oganesian et al. | 361/707 |
| 2012/0068327 A1 | 3/2012 | Oganesian | |
| 2012/0068330 A1 | 3/2012 | Oganesian | |
| 2012/0068351 A1 | 3/2012 | Oganesian | |
| 2012/0068352 A1 | 3/2012 | Oganesian | |
| 2012/0182706 A1 | 7/2012 | Siomkos et al. | |
| 2012/0194719 A1* | 8/2012 | Churchwell et al. | 348/302 |

FOREIGN PATENT DOCUMENTS

| | | |
|---|---|---|
| CN | 101859752 A | 10/2010 |
| TW | 201029147 | 4/2010 |
| TW | 200421565 | 8/2010 |
| TW | 201013855 | 8/2010 |

OTHER PUBLICATIONS

U.S. Appl. No. 13/157,193, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
Official Letter (Taiwanese Translation only) as received from the Taiwanese Patent Office in connection with the related Taiwanese Patent Application No. 101118947 dated May 20, 2014, and, English Translation of the Search Report.
First Office Action (English and Chinese Translations attached) mailed on Jul. 30, 2014 as received from the Chinese Patent Office in connection with the related Chinese Patent Application No. 2011101906842.
Second Office Action (English and Chinese Translations attached) mailed on Mar. 6, 2015 as received from the Chinese Patent Office in connection with the related Chinese Patent Application No. 201110190684.2.

* cited by examiner

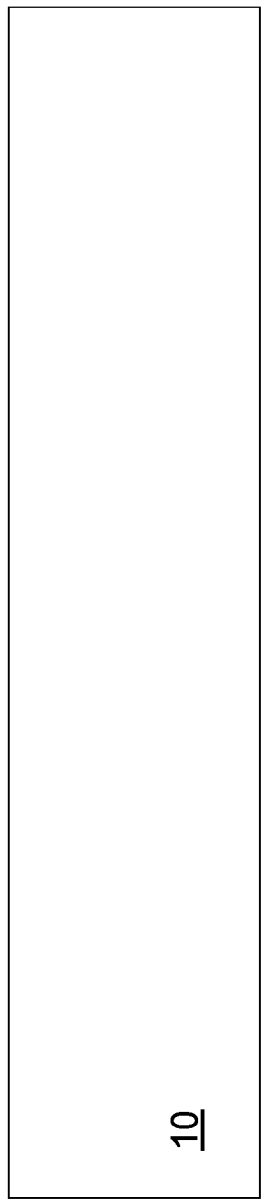

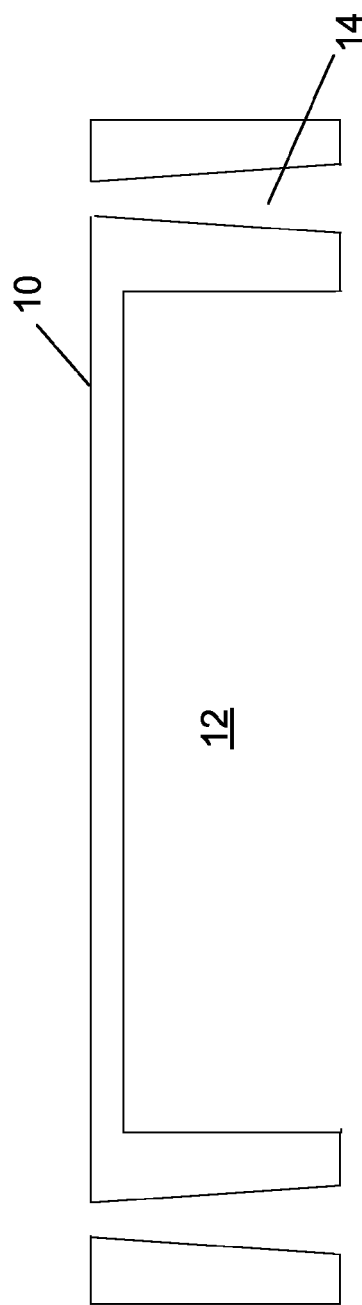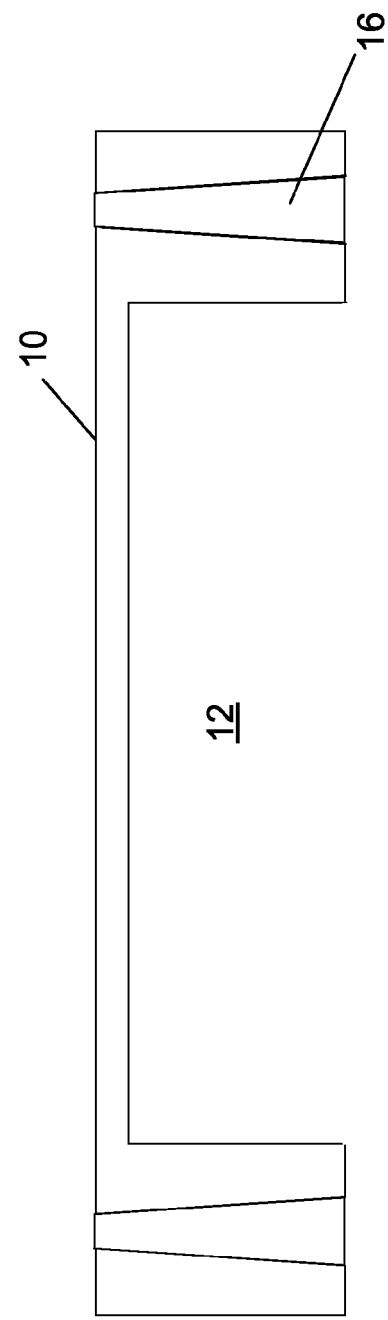

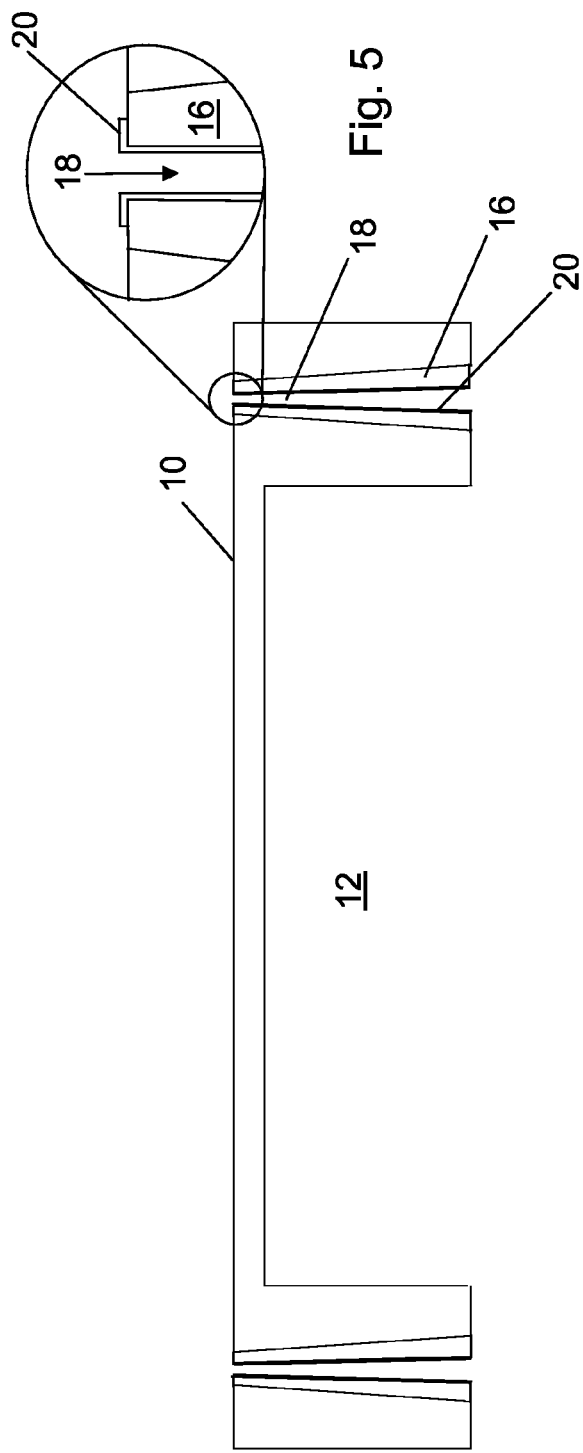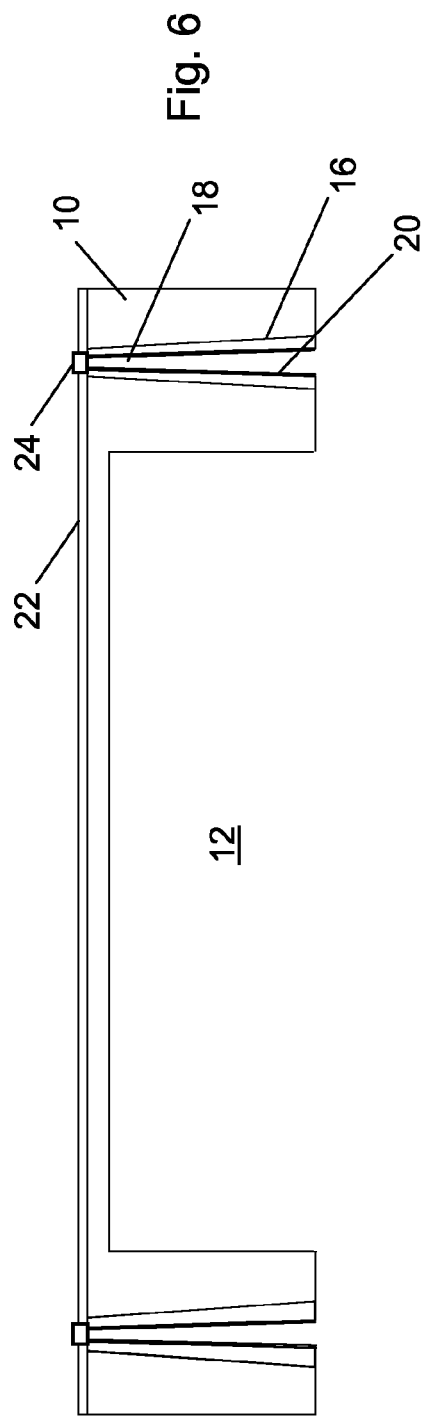
Fig. 5
Fig. 6

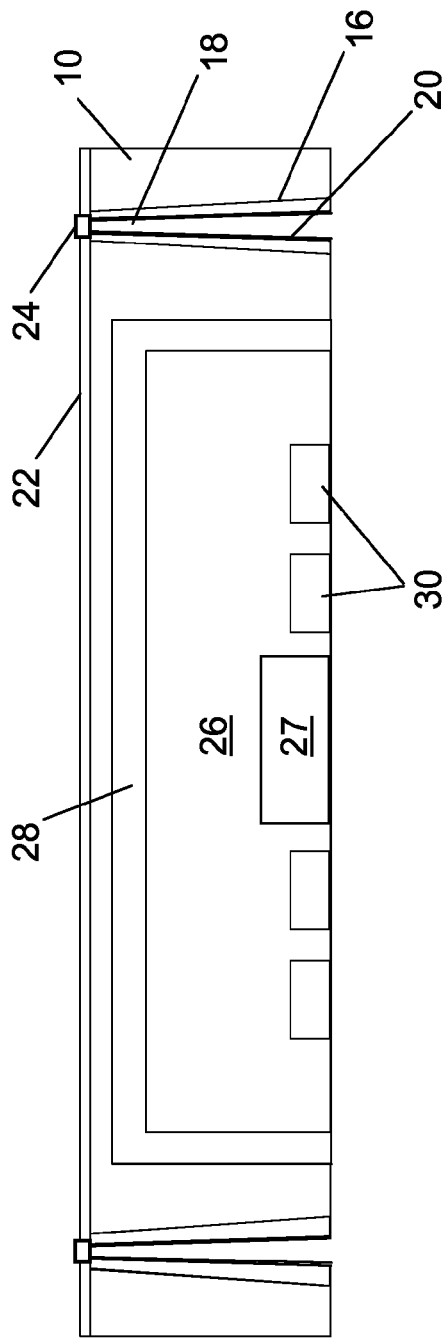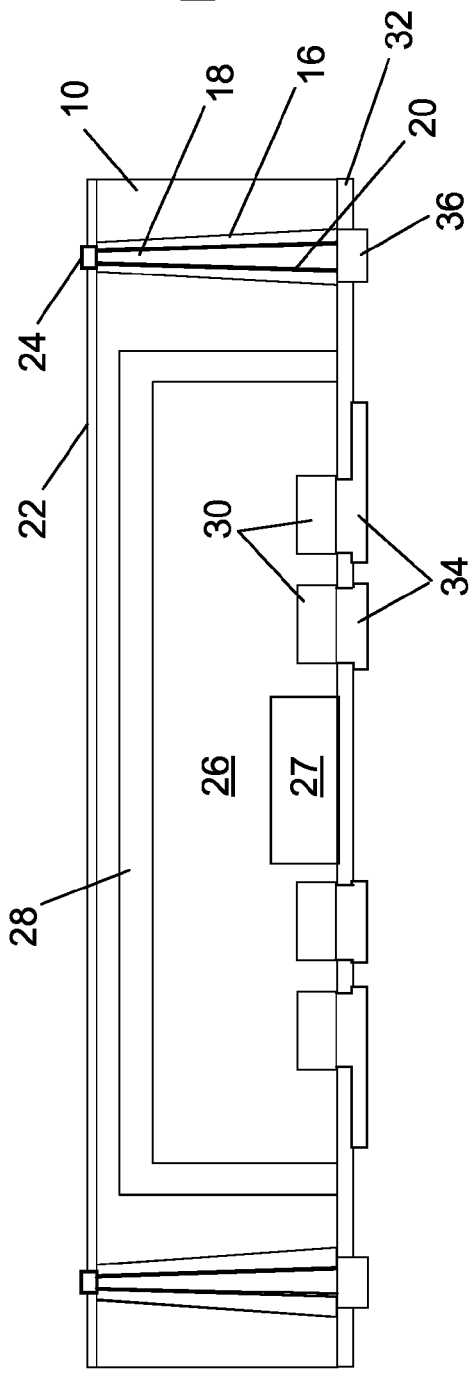

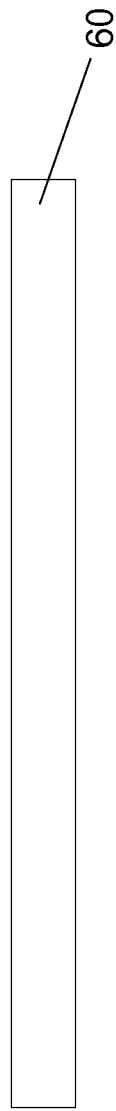
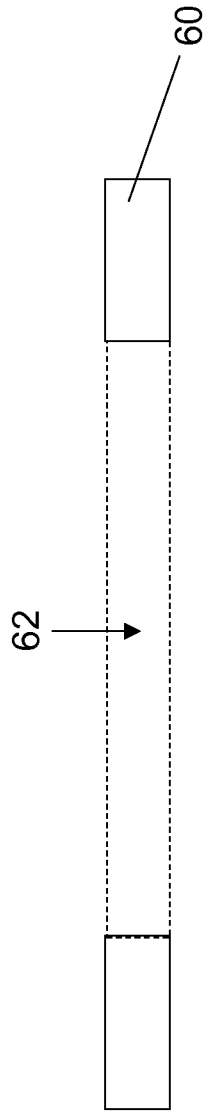
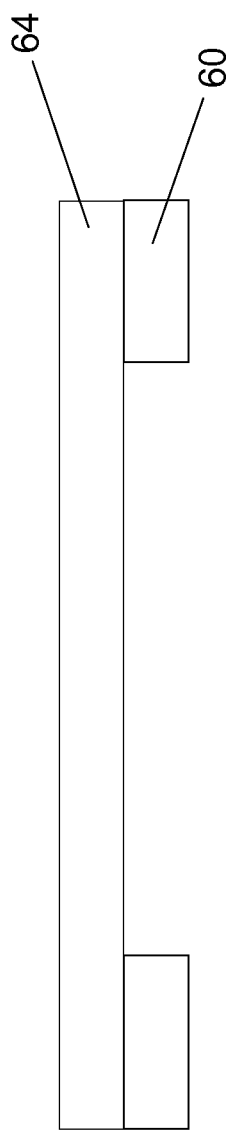
Fig. 11
Fig. 12
Fig. 13

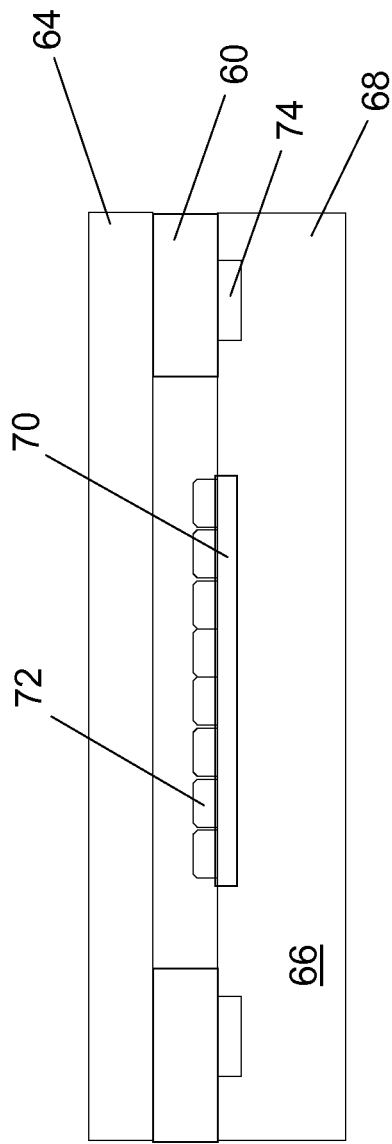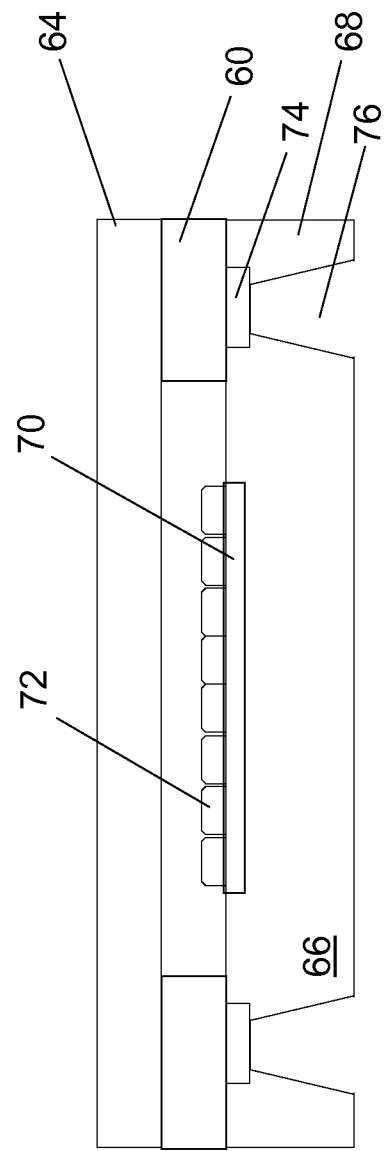

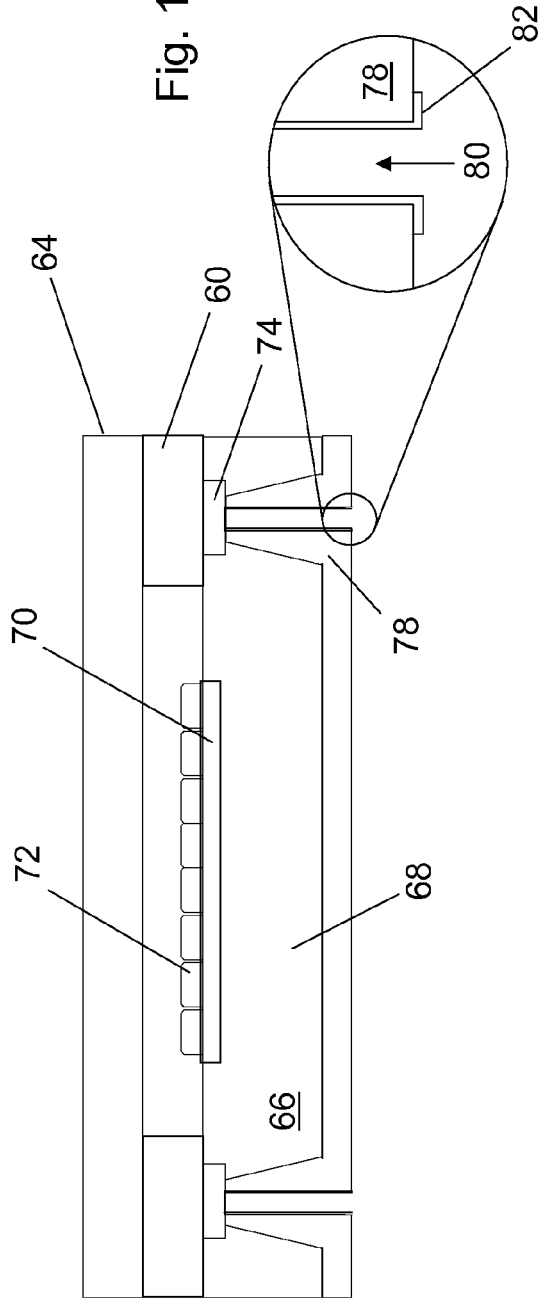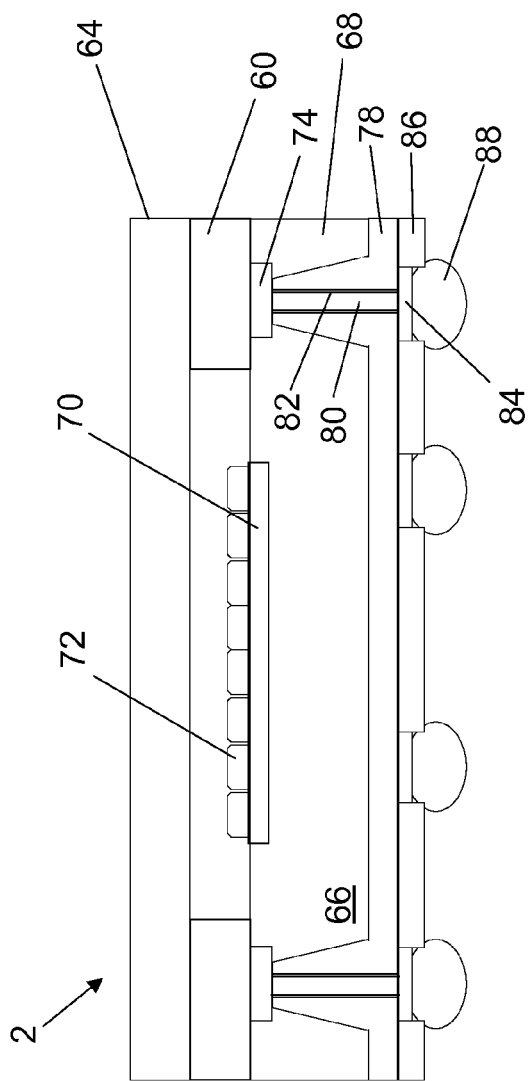

METHOD OF FORMING 3D INTEGRATED MICROELECTRONIC ASSEMBLY WITH STRESS REDUCING INTERCONNECTS

RELATED APPLICATIONS

This application is a divisional of U.S. application Ser. No. 13/157,202, filed Jun. 9, 2011, U.S. Pat. No. 8,552,518.

FIELD OF THE INVENTION

The present invention relates to semiconductor packaging, and more particularly to a 3D integration package in which a semiconductor device package is mounted on another semiconductor device package.

BACKGROUND OF THE INVENTION

The trend for semiconductor devices is smaller integrated circuit (IC) devices (also referred to as chips), packaged in smaller packages (which protect the chip while providing off chip signaling connectivity). With related chip devices (e.g. an image sensor and its processor), one way to accomplish size reduction is to form both devices as part of the same IC chip (i.e. integrate them into a single integrated circuit device). However, that raises a whole host of complex manufacturing issues that can adversely affect operation, cost and yield. Another technique for combining related chip devices is 3D IC packaging, which saves space by stacking separate chips inside a single package or stacking one chip packing on another chip package.

3D packaging can result in increased density and smaller form factor, better electrical performance (because of shorter interconnect length which allows for increased device speed and lower power consumption), better heterogeneous integration (i.e. integrate different functional layers such as an image sensor and its processor), and lower cost.

However, 3D integration for microelectronics packaging faces challenges as well, such as high cost of 3D processing infrastructure and sustainable supply chain. Existing 3D IC packaging techniques to form through-silicon via's (TSV's), including Via-First, Via-Last and Via-middle processes, utilize semiconductor lithographic processes which are inherently complex and costly. As a result, few companies in the world can afford the billions of dollars in CMOS R&D per year to keep pace. Moreover, interconnects between IC packages can fail due to the stresses incurred during manufacturing and mounting, as well as thermal or vibrational stresses incurred during operation. A complementary, cost-effective TSV solution is needed to enable use of a separate but closely coupled image processor enabling the pixel array area on the image sensor to be maximized, and enable direct memory access, by stacking and vertically interconnecting multiple chips.

BRIEF SUMMARY OF THE INVENTION

The present invention is a microelectronic assembly providing a novel 3D integration package for packaging/encapsulating IC devices, and enables 3D integration of multiple related but distinct IC devices such as an image sensor with its processor.

The microelectronic assembly comprises first and second microelectronic elements. The first microelectronic element includes a substrate with first and second opposing surfaces, a semiconductor device, and conductive pads at the first surface which are electrically coupled to the semiconductor device. The second microelectronic element includes a handler with first and second opposing surfaces, a second semiconductor device, and conductive pads at the handler first surface which are electrically coupled to the second semiconductor device. The first and second microelectronic elements are integrated to each other such that the second surfaces face each other. The first microelectronic element includes conductive elements each extending from one of the conductive pads and through the substrate to the second surface, of the first microelectronic element. The second microelectronic element includes conductive elements each extending between the first and second surfaces of the handler. Each of the conductive elements of the first microelectronics element is electrically coupled to at least one of the conductive elements of the second microelectronics element.

The method of forming the microelectronic assembly comprises providing first and second microelectronic elements. The first microelectronic element comprises a substrate with first and second opposing surfaces, a semiconductor device, and conductive pads at the first surface which are electrically coupled to the semiconductor device. The second microelectronic element comprises a handler with first and second opposing surfaces, a second semiconductor device, and conductive pads at the handler first surface which are electrically coupled to the second semiconductor device. The method further comprises forming conductive elements each extending from one of the conductive pads and through the substrate to the second surface, of the first microelectronic element, forming conductive elements each extending between the first and second surfaces of the handler, and integrating the first and second microelectronic elements to each other such that the second surfaces face each other and such that each of the conductive elements of the first microelectronics element is electrically coupled to at least one of the conductive elements of the second microelectronics element.

Other objects and features of the present invention will become apparent by a review of the specification, claims and appended figures.

BRIEF DESCRIPTION OF THE DRAWINGS

FIGS. 1-10 are cross sectional side views of a semiconductor packaging structure showing in sequence the steps in the processing of the packaging structure in the formation of the first packaging structure.

FIGS. 11-17 are cross sectional side views of a semiconductor packaging structure showing in sequence the steps in the processing of the packaging structure in the formation of the second packaging structure.

DETAILED DESCRIPTION OF THE INVENTION

Figure 9:
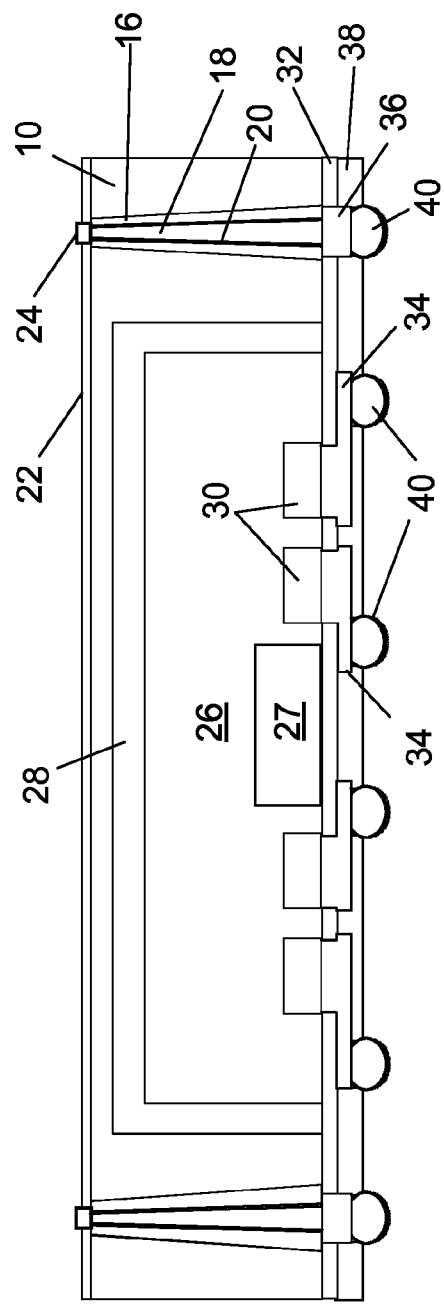
Figure 10:
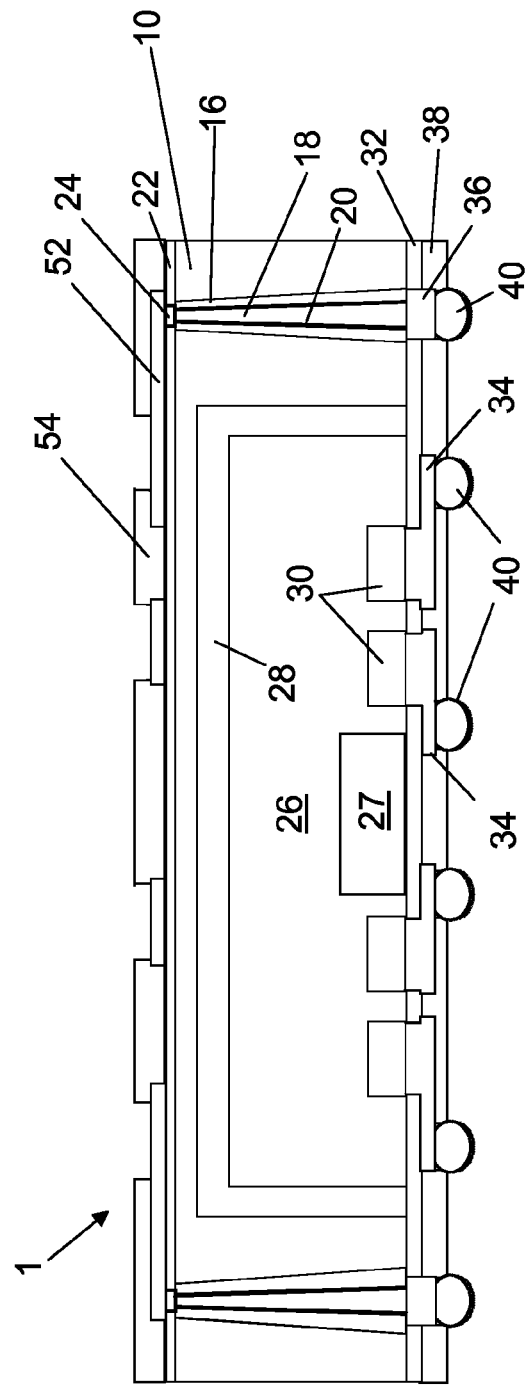

The present invention is wafer level 3D IC integration package solution that is ideal for packaging/encapsulating IC devices, and enables 3D integration of multiple related IC devices such as image sensors and their processors. The formation of the 3D integration package is described below, first with respect to the formation of a first package for a first IC device, then a second package for a second IC package, then the integration of the two packages to form a microelectronic assembly that integrates the two IC devices.

FIGS. 1-10 illustrate the formation of the first package 1. The first package formation process begins with a crystalline handler 10 as shown in FIG. 1. A non-limiting example can include a handler of crystalline having a thickness of around 600 μm. A cavity 12 is formed in the handler, as shown in FIG. 2. Cavity 12 can be formed by the use of a laser, a plasma etching process, a sandblasting process, a mechanical milling process, or any other similar method. Preferably cavity 12 is formed by photo-lithography plasma etching, which includes forming a layer of photo resist on the handler 10, patterning the photo resist layer to expose a select portion of handler 10, and then performing a plasma etch process (e.g. using a SF6 plasma) to remove the exposed portion of the handler 10 to form the cavity 12. Preferably, the cavity extends no further than ¾ of the crystalline thickness, or at least leaves a minimum thickness at the bottom of the cavity of around 50 μm. The plasma etch can be anisotropic, tapered, isotropic, or combinations thereof.

Through holes (via's) 14 are then formed through the thickness of the handler 10 adjacent to but connecting with the cavity 12, as illustrated in FIG. 3. Holes 14 can be formed using a laser, a plasma etching process, a sandblasting process, a mechanical milling process, or any similar method. Preferably, the through holes 14 are formed by plasma etching in a similar manner as the formation of the cavity 12 (except that the holes 14 extend all the way through the thickness of the crystalline handler 10). Plasma silicon etching (e.g. anisotropic, tapered, isotropic, or combinations thereof) allows for various shapes of the via profile. Preferably, the profile of holes 14 is tapered, with a larger dimension at the surface through which cavity 12 was formed. Preferably the minimum hole diameter is around 25 μm, and the angles of the walls are between 5° and 35° relative to a direction perpendicular to the surfaces of the crystalline handler through which the holes 14 are formed, such that the hole has a smaller cross-sectional size at one surface of the crystalline handler 10 than the other surface.

The through holes 14 are then filled with a compliant dielectric material 16 as shown in FIG. 4, using a spin coating process, a spray process, a dispense process, an electrochemical deposition process, a lamination process, or any other similar method. A compliant dielectric is a relatively soft material (e.g. solder mask) that exhibits compliance in all three orthogonal directions, and can accommodate the coefficient of thermal expansion (CTE) mismatch between the silicon (~2.6 ppm/° C.) and Cu (~17 ppm/° C.) interconnect. Compliant dielectric material 16 is preferably a polymer, such as BCB (Benzocyclobutene), solder mask, solder resist, or BT epoxy resin.

Through holes 18 are then formed through the dielectric material 16. Holes 18 can be formed by using a $CO_2$ laser (e.g. spot size of about 70 μm) for larger sized holes 18, or a UV laser (e.g. spot size of about 20 μm at a wavelength of 355 nm) for smaller sized holes 18 (e.g. less than 50 μm in diameter). Laser pulse frequencies between 10 and 50 kHz at a pulse length of less than 140 ns can be used. The side walls of the through holes 18 are then metalized (i.e. coated with a metallization layer 20). The metallization process preferably starts with the desmear process for removing any resin smeared on the interior walls of the through holes 18 (caused by the drilling through dielectric materials such as epoxy, polyimide, cyanate ester resins, etc). The process involves contacting the resin smear with a mixture of gamma-butyrolactone and water to soften the resin smear, followed by treatment with an alkaline permanganate solution to remove the softened resin, and treatment with an aqueous acidic neutralizer to neutralize and remove the permanganate residues. After desmear treatment, the initial conductive metallization layer 20 is formed by electroless copper plating, followed by a photo-lithography etch back so that the metallization layer extends away from the holes 18 along dielectric 16 for a short distance (e.g. 25 μm or more) at both ends of holes 18 (but not so far as to make electrical contact with crystalline 10). Adhesion is obtained at the plated interface by an anchor effect from the surface roughness. The resulting structure is shown in FIG. 5.

A dielectric layer 22 is then formed on the surface of the handler that does not contain the opening to cavity 12. Preferably, this is done by applying a photo-imagable dielectric on the handler surface by use of a spin coating process or a spray process. A photo-lithographic process (i.e. UV exposure, selective material removal) is then used to selectively remove portions of the dielectric layer 22 over (and thus exposing) through-holes 18 and horizontal portions of metallization layer 20. A metal layer is then sputtered over dielectric layer 22. A photo-lithographic process (i.e. resist layer deposition, UV exposure through a mask, removal of selected portions of resist to expose selected portions of metal layer, metal etching, and photo resist removal) is used to selectively remove portions of the metal layer leaving metal pads 24 disposed over through holes 18 and in electrical contact with metallization layer 20. The resulting structure is shown in FIG. 6. While not shown, the center of the metal pads 24 may have a small hole there through aligned with through-holes 18.

An IC chip 26 is inserted into cavity 12 as shown in FIG. 7. The IC chip 26 includes an integrated circuit (i.e. semiconductor device) 27. The IC chip 26 is insulated from handler 10 by a dielectric insulating layer 28. The insertion of the IC chip 26 and formation of the insulating layer 28 can be performed in several ways. One way is to form the insulating layer 28 on the walls of the cavity 12 before insertion of the bare IC chip 26 (e.g. by spray coating epoxy, by electro-chemical deposition, etc.). A second way is to form the insulating layer 28 on the back surfaces of IC chip 26 before it is inserted into cavity 12. A third way is to form insulating layers both on the cavity walls and on the IC chip back surfaces before chip insertion, where the two insulating layers are bonded together upon chip insertion to form insulation layer 28. The IC chip 26 includes bonding pads 30 exposed on its bottom surface.

An encapsulation insulation layer 32 is then formed on the structure which encapsulates IC chip 26 inside cavity 12. Preferably, layer 32 is formed using a photo-imagable dielectric (e.g. a solder mask). The layer is pre-cured to partially remove solvent so the surface is not tacky. A photo lithography step is then performed (i.e. UV exposure through mask), after which select portions of the insulation layer 32 are removed to expose the IC chip bond pads 30 and the metallization layer 20 extending out of the through holes 18. Post curing can then be performed to increase the surface hardness of layer 32. A metal layer is then deposited over insulation layer 32 (e.g. by metal sputtering, followed by the deposition of a photo-imagable resist layer). A photo lithography step is then performed (i.e. UV exposure through mask and selective resist layer removal), followed by selective metal etching of those portions exposed by the photo resist removal, leaving metal fan-out and fan-in bond pads 34 in electrical contact with IC chip bond pads 30, and leaving interconnect bond pads 36 in electrical contact with the metallization layer 20 extending out of through holes 18. Metal plating of the bond pads 34/36 can occur here as well. The resulting structure is shown in FIG. 8 (after photo resist removal).

An encapsulation insulation layer 38 is then formed over insulation layer 32 and bond pads 34/36, followed by a selective etch back to expose bond pads 34/36. The selective etch back can be performed by a photo-lithographic process to selectively remove those portions of layer 38 over bond pads 34/36. BGA interconnects 40 are then formed on bond pads 34/36 using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto bond pads. The resulting structure is shown in FIG. 9.

A metal layer is then deposited over insulation layer 22 (e.g. by metal sputtering, followed by the deposition of a photo-imagable resist layer). A photo lithography step is then performed (i.e. UV exposure through mask and selective resist layer removal), followed by selective metal etching of those portions exposed by the photo resist removal, leaving metal fan-out and fan-in bond pads 52 which are in electrical contact with metal pads 24. Metal plating of the bond pads 52 can occur here as well. An insulation layer 54 is then formed over insulation layer 22 and bond pads 52, followed by a selective etch back to expose select portions of bond pads 52. The selective etch back can be performed by a photo-lithographic process to selectively remove those portions of layer 54 over the select portions of bond pads 52. The resulting structure is the microelectronic device shown in FIG. 10 (after photo resist removal).

FIGS. 11-17 illustrate the formation of the second package. The second package formation process begins with a compliant supportive structure, such as for example a polymer sheet 60, as shown in FIG. 11. A non-limiting example can include a sheet of polymer having a thickness of around 100 µm. A hole 62 is formed through the polymer sheet support structure 60, as shown in FIG. 12. Hole 62 can be formed by the use of a laser, a plasma etching process, a sandblasting process, a mechanical milling process, or any other similar method. Preferably hole 62 is formed by a laser. A transparent protective layer 64 such as a transparent glass wafer is attached to compliant polymer sheet 60 where it covers hole 62, as illustrated in FIG. 13. Preferably protective layer 64 is at least 100 µm thick.

The compliant sheet and protective layer 60/64 are then attached to a second IC chip 66, as illustrated in FIG. 14. In the exemplary embodiment of FIG. 14, IC chip 66 is an image sensor, which includes a substrate 68, an array of pixel sensors 70, a color filter and microlens array 72 over the pixel sensors 70, and bond pads 74 electrically coupled to the pixel sensors 70 for supplying output electrical signals from the pixel sensors. An optional thinning of the silicon substrate 68 can be performed after the attachment of substrate/cover 60/64, preferably leaving substrate 68 with a thickness of at least 50 µm.

Electrical interconnects are formed in silicon 68 in similar manner as described above with respect to electrical interconnects formed through handler 10. Specifically, holes 76 are formed into the bottom surface of substrate 68 until they reach and expose bond pads 74, as illustrated in FIG. 15. Holes 76 can be formed using a laser, a plasma etching process, a sandblasting process, a mechanical milling process, or any similar method. Preferably, the holes 76 are formed by plasma etching (e.g. anisotropic, tapered, isotropic, or combinations thereof), which allows for various shapes of the hole profile. Preferably, the profile of holes 76 is tapered, with a larger dimension at the surface through which the holes 76 are made, and a smaller dimension at bond pads 74. Preferably the minimum hole diameter of bond pads 74 is around 10 µm, and the angles of the walls are between 5° and 35° relative to a direction perpendicular to the surface of the silicon 68 through which the holes 76 are formed.

A layer of compliant dielectric material 78 is formed that covers the bottom surface of substrate 68 and fills holes 76, as shown in FIG. 16, using a spin coating process, a spray process, a dispense process, an electrochemical deposition process, a lamination process, or any other similar method. Compliant dielectric material 78 is preferably a polymer, such as BCB (Benzocyclobutene), solder mask, solder resist, BT epoxy resin or epoxy acrylate. Holes 80 are then formed through the dielectric material 78, as shown in FIG. 16. Holes 80 can be formed by using a $CO_2$ laser (e.g. spot size of about 70 µm) for larger sized holes 80, or a UV laser (e.g. spot size of about 20 µm at a wavelength of 355 nm) for smaller sized holes 80 (e.g. less than 50 µm in diameter). Laser pulse frequencies between 10 and 50 kHz at a pulse length of less than 140 ns can be used. The side walls of holes 80 are then metalized (i.e. coated with a metallization layer 82), making electrical contact with bonding pads 74. The metallization process preferably starts with the desmear process for removing any resin smeared on the interior walls of the holes 80 (caused by the drilling through dielectric materials such as epoxy, polyimide, cyanate ester resins, etc). The process involves contacting the resin smear with a mixture of gamma-butyrolactone and water to soften the resin smear, followed by treatment with an alkaline permanganate solution to remove the softened resin, and treatment with an aqueous acidic neutralizer to neutralize and remove the permanganate residues. After desmear treatment, the initial conductive metallization layer 82 is formed by electroless copper plating, followed by a photo-lithography etch back so that the metallization layer extends away from the holes 80 along dielectric 78 for a short distance. Adhesion is obtained at the plated interface by an anchor effect from the surface roughness. The resulting structure is shown in FIG. 16.

A metal layer is then formed on insulation layer 78 (e.g. by metal sputtering, followed by the deposition of a photo-imagable resist layer). A photo lithography step is then performed (i.e. UV exposure through mask and selective resist layer removal), followed by selective metal etching of those portions expose by the photo resist removal, leaving metal bond pads 84 which are in electrical contact with metallization layer 82 extending from holes 80. Metal plating of the bond pads 84 can occur here as well. An insulation layer 86 is then formed over insulation layer 78 and bond pads 84, followed by a selective etch back to expose bond pads 84. The selective etch back can be performed by a photo-lithographic process to selectively remove those portions of layer 86 over the bond pads 84. BGA interconnects 88 are then formed on bond pads 84 using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto bond pads. The resulting structure is the microelectronic device shown in FIG. 17.

Figure 18:
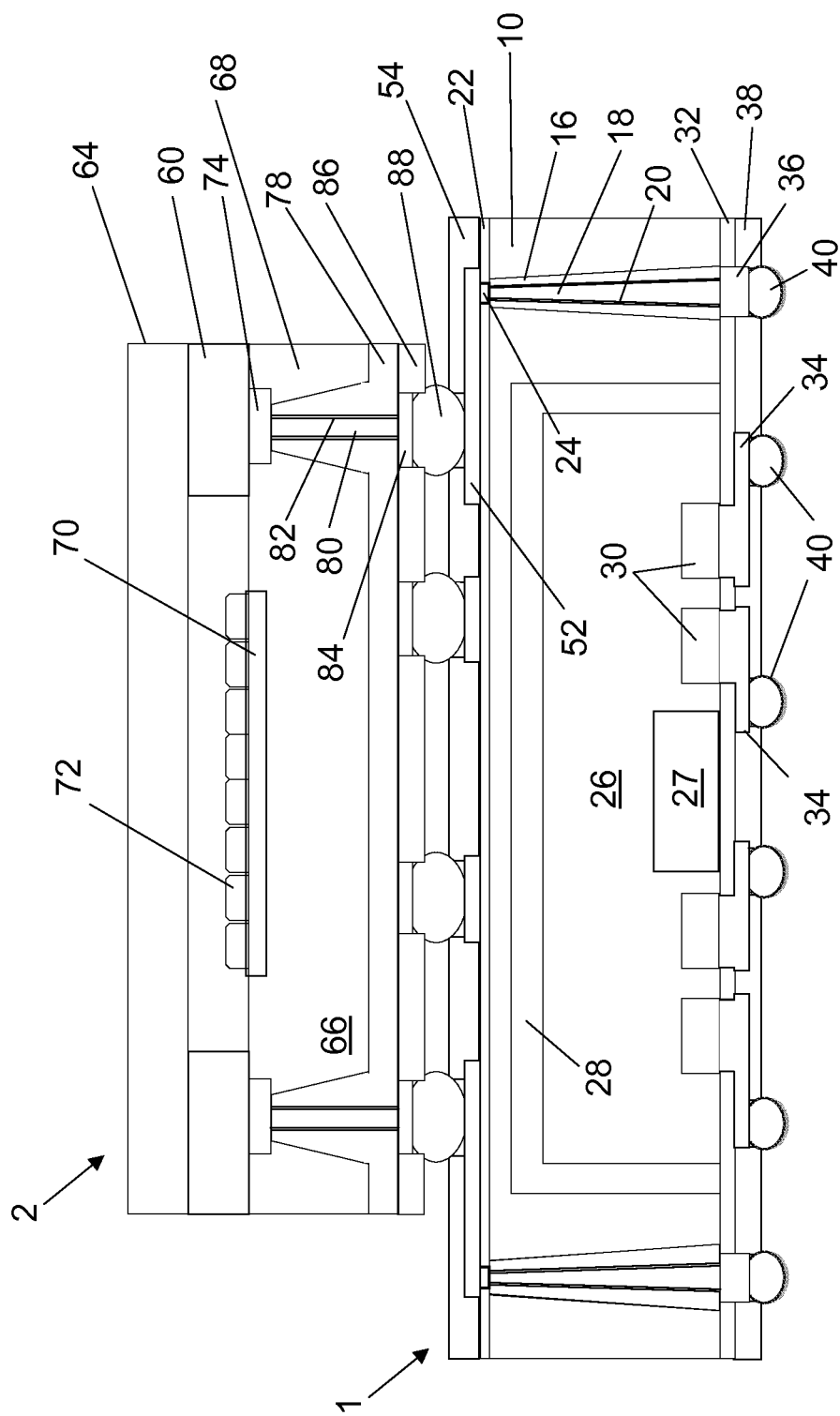
FIG. 18 is a cross sectional side view of the second packaging structure mounted to the first packaging structure.

The second package 2 is then integrated (i.e. mechanically attached or mounted), to the first package 1 as illustrated in FIG. 18, where BGA interconnects 88 of the second package 2 contact and make electrical connections with bond pads 52 of the first package 1. Integration can be performed using conventional pick-and-place or die attachment equipment. Preferably this is performed in a heated environment, so that BGA interconnects 88 bond with (and make a secure electrical connection between) both packages 1 and 2. The resulting structure is a pair of microelectronic devices attached together, with bond pads on their respective surfaces that face away from each other (outwardly facing surfaces). The bond pads of one of the microelectronic devices are coupled to bond pads on the outward facing surface of the other microelectronic device (via electrically conductive elements that extend through the first microelectronic device and electrically conductive elements that extend through the second microelectronic device), so that bond pads on that outward facing surface of the other microelectronic device provide signals from both microelectronic devices.

The IC packaging technique and the method of its manufacture described above and illustrated in the figures have several advantages. First, the silicon based IC chip 26 is housed inside handler 10, which provides mechanical and environmental protection of IC chip 26. Second, utilizing a compliant dielectric material 28 for securing IC chip 26 inside handler 10 reduces thermal and mechanical stresses that could adversely affect both. Third, using a handler structure with fan-out and fan-in pads for packaging IC chip 26 (which can be separately tested and verified before insertion into packaging 10) enhances reliability and yield. Fourth, electrical connections for both chips are provided on a common surface of the handler 10, for efficient signal coupling and connection. Fifth, utilizing a wafer level dielectric lamination for layer 32 provides very low impedance across a very wide frequency range. This impedance can be as much as an order of magnitude or more lower than existing spray and spin coated dielectrics. These ultra-thin dielectric laminates also offer the advantage of dampening noise on the power and ground planes and will be important for achieving acceptable electrical performance in future high speed digital designs.

There are also a number of advantages of the through-polymer-interconnect formed through holes 18. First, these interconnects are conductive elements that reliably re-route the electrical signals from package 2, through handler structure 10, to the same side of the handler structure 10 which contains the electrical contacts for the IC chip 26. Second, by forming the walls of through-holes 14 with a slant, it reduces potentially damaging inducing stress on the crystalline that can result from 90 degree corners. Third, the slanted sidewalls of holes 14 also mean there are no negative angle areas that can result in gaps formed with dielectric material 16. Fourth, by forming insulation material 16 first, and then forming metallization layer 20 thereon, metal diffusion into the crystalline structure of handler 10 is avoided. Fifth, forming metal layer 20 using a plating process is superior to other metallization techniques such as sputter deposition, because the plating process is less likely to damage insulation material 16. Sixth, using a compliant insulation material 16 to form the sidewalls of holes 18 is more reliable. Finally, the creation of the through-polymer-interconnects using laser drilling through polymer, desmearing, and metal plating, is less expensive than using semiconductor sputtering and metal deposition tools.

The through-polymer-interconnects formed through holes 80 provide the same advantages as those mentioned above formed through hole 18 (i.e. conductive elements that route electrical signals from bond pads 74, through substrate 68, for electrical coupling to bond pads 52 via bond pads 84). Additionally, the through-polymer-interconnects formed through holes 18 and 80 absorb stresses that could otherwise damage the surrounding structure, given the use of compliant materials 16 and 78. Additional stresses are absorbed by having the interconnects in holes 80 terminate at the bond pads 74, by having a compliant substrate over bond pads 80, and by using a compliant material for insulation layer 86.

The packaging configuration described above is ideal for and described in the context of (but not necessarily limited to) IC chip 66 being an image sensor, and IC chip 26 being a processor for processing the signals from the image sensor. An image sensor is a complementary metal-oxide semiconductor (CMOS) device that includes an integrated circuit containing an array of pixel sensors, each pixel containing a photodetector and preferably its own active amplifier. Each pixel sensor converts the light energy to a voltage signal. Additional circuitry on the chip may be included to convert the voltage to digital data. The image processing chip comprises a combination of hardware processor(s) and software algorithms. The image processor gathers the luminance and chrominance information from the individual pixels sensors and uses it to compute/interpolate the correct color and brightness values for each pixel. The image processor evaluates the color and brightness data of a given pixel, compares them with the data from neighboring pixels and then uses a demosaicing algorithm to reconstruct a full color image from the incomplete color samples, and produces an appropriate brightness value for the pixel. The image processor also assesses the whole picture and corrects sharpness and reduce noise of the image.

The evolution of image sensors results in the ever higher pixel count in image sensors, and the additional camera functionality, such as auto focus, zoom, red eye elimination, face tracking, etc, which requires more powerful image sensor processors that can operate in higher speeds. Photographers don't want to wait for the camera's image processor to complete its job before they can carry on shooting—they don't even want to notice some processing is going on inside the camera. Therefore, image processors must be optimized to cope with more data in the same or even shorter period of time.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the IC packaging of the present invention. Single layers of material could be formed as multiple layers of such or similar materials, and vice versa. While the inventive packaging configuration is disclosed in the context of IC chip 26 being an image sensor processor and IC chip 66 being an image sensor, the present invention is not necessary limited to those IC chips.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a microelectronic assembly, comprising:
   providing a first microelectronic element that comprises:
      a substrate with first and second opposing surfaces,
      a semiconductor device integrally formed on or in the first surface of the substrate, and
      conductive pads at the first surface which are electrically coupled to the semiconductor device;
   providing a second microelectronic element comprising:
      a handler with first and second opposing surfaces, and a cavity formed into the first surface that extends toward but does not reach the second surface,
      an IC chip disposed in the cavity and having a bottom surface with conductive pads facing away from the second surface;
   forming conductive elements each extending from one of the conductive pads and through the substrate to the second surface, of the first microelectronic element;
   forming conductive elements each extending between the first and second surfaces of the handler;
   integrating the first and second microelectronic elements to each other such that the second surfaces face each other and such that each of the conductive elements of the first microelectronics element is electrically coupled to at least one of the conductive elements of the second microelectronics element;
   forming electrical interconnects over the first surface of the handler with each electrically coupled to at least one of the conductive elements of the second microelectronics element; and
   forming electrical interconnects over the bottom surface of the IC chip with each electrically coupled to at least one of the conductive pads of the IC chip.

2. The method of claim 1, the forming of each of the conductive elements of the first microelectronic element comprises:
   forming a hole in the substrate with a sidewall extending from the second surface of the substrate to one of the conductive pads of the first microelectronic element;
   forming a compliant dielectric material disposed along the sidewall; and
   forming a conductive material disposed along the compliant dielectric material and extending between the second surface of the substrate and the one conductive pad of the first microelectronic element.

3. The method of claim 2, wherein the compliant dielectric material includes a polymer.

4. The method of claim 2, wherein for each of the conductive elements of the first microelectronic element, the hole is tapered such that the hole has a smaller cross-sectional dimension at the one conductive pad than at the second surface of the substrate.

5. The method of claim 2, wherein for each of the conductive elements of the first microelectronic element, the sidewall extends in a direction between 5° and 35° relative to a direction that is perpendicular to the first and second surfaces of the substrate.

6. The method of claim 1, wherein the forming of each of the conductive elements of the second microelectronic element comprises:
   forming a hole in the handler with a sidewall extending between the first and second surfaces of the handler;
   forming a compliant dielectric material disposed along the sidewall; and
   forming a conductive material disposed along the compliant dielectric material and extending between the first and second surfaces of the handler.

7. The method of claim 6, wherein the compliant dielectric material includes a polymer.

8. The method of claim 6, wherein for each of the conductive elements of the second microelectronic element, the hole is tapered such that the hole has a smaller cross-sectional dimension at the second surface than at the first surface of the handler.

9. The method of claim 6, wherein for each of the conductive elements of the second microelectronic element, the sidewall extends in a direction between 5° and 35° relative to a direction that is perpendicular to the first and second surfaces of the handler.

10. The method of claim 1, wherein the semiconductor device of the first microelectronic assembly is an image sensor and the IC chip of the second microelectronic assembly is a processor for processing signals from the image sensor.

11. The method of claim 10, wherein the image sensor comprises an array of pixel sensors each including a photodetector for converting light energy to a voltage signal, and wherein the processor is configured to receive the voltage signals and to compute or interpolate color and brightness values for each of the voltage signals from the pixel sensors.

12. The method of claim 1, wherein the integration comprises:
   forming a plurality of BGA interconnects each electrically coupled between one of the conductive pads of the first microelectronic elements and one of the conductive pads of the second microelectronic elements.

* * * * *